United States Patent
Qin et al.

(10) Patent No.: US 11,844,239 B2
(45) Date of Patent: Dec. 12, 2023

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Chengjie Qin, Beijing (CN); Rui Hong, Beijing (CN); Chunyan Xie, Beijing (CN); Tao Wang, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 623 days.

(21) Appl. No.: 16/980,836

(22) PCT Filed: Apr. 17, 2020

(86) PCT No.: PCT/CN2020/085425
§ 371 (c)(1),
(2) Date: Sep. 14, 2020

(87) PCT Pub. No.: WO2020/238467
PCT Pub. Date: Dec. 3, 2020

(65) Prior Publication Data
US 2022/0384540 A1    Dec. 1, 2022

(30) Foreign Application Priority Data
May 27, 2019  (CN) .......................... 201910448524.X

(51) Int. Cl.
*H10K 59/122*  (2023.01)
*H10K 50/844*  (2023.01)
(Continued)

(52) U.S. Cl.
CPC ......... *H10K 59/122* (2023.02); *H10K 50/844* (2023.02); *H10K 71/00* (2023.02); *H10K 59/1201* (2023.02)

(58) Field of Classification Search
CPC .. H10K 59/122; H10K 59/1201; H10K 71/00; H10K 50/844
See application file for complete search history.

(56) References Cited

U.S. PATENT DOCUMENTS

2017/0237038 A1* 8/2017 Kim ..................... H10K 50/844
                                                          257/40
2019/0067390 A1* 2/2019 Gao ................... H10K 59/1315
(Continued)

FOREIGN PATENT DOCUMENTS

CN    106887523 A    6/2017
CN    107452894 A    12/2017
(Continued)

OTHER PUBLICATIONS

Office Action dated Dec. 2, 2020 for Chinese Patent Application No. 201910448524.X and English Translation.
(Continued)

*Primary Examiner* — Shaun M Campbell
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a display area, a mounting hole located in the display area, and an encapsulation region located between the display area and the mounting hole. The encapsulation region includes an insulating layer, an encapsulation pixel definition layer arranged on the insulating layer, and a partition structure layer arranged on the encapsulation pixel definition layer. The encapsulation pixel definition layer includes multiple spaced protrusions, the partition structure
(Continued)

layer includes multiple spaced columns, the columns are arranged on the protrusions, a functional layer is arranged on the multiple spaced columns, and the functional layer is broken by the columns.

16 Claims, 7 Drawing Sheets

(51) Int. Cl.
*H10K 71/00* (2023.01)
*H10K 59/12* (2023.01)

(56) References Cited

U.S. PATENT DOCUMENTS

| | | | |
|---|---|---|---|
| 2019/0081117 A1* | 3/2019 | Moon | H10K 50/844 |
| 2019/0123115 A1* | 4/2019 | Sun | H10K 50/844 |
| 2019/0326359 A1* | 10/2019 | Yang | H10K 59/122 |
| 2020/0027936 A1 | 1/2020 | Wang et al. | |
| 2020/0295102 A1 | 9/2020 | Qin et al. | |

FOREIGN PATENT DOCUMENTS

| | | |
|---|---|---|
| CN | 107808896 A | 3/2018 |
| CN | 108899352 A | 11/2018 |
| CN | 108899382 A | 11/2018 |
| CN | 109599499 A | 4/2019 |
| CN | 109742117 A | 5/2019 |
| CN | 109801956 A | 5/2019 |
| CN | 109802052 A | 5/2019 |
| CN | 10120464 A | 8/2019 |

OTHER PUBLICATIONS

International Search Report for PCT/CN2020/085425 dated Jul. 15, 2020.
Office Action dated Jul. 28, 2021 for Chinese Patent Application No. 201910448524.X and English Translation.
Office Action dated May 20, 2021 for Chinese Patent Application No. 201910448524.X and English Translation.

* cited by examiner

DISPLAY SUBSTRATE AND PREPARATION METHOD THEREOF, AND DISPLAY APPARATUS

CROSS-REFERENCE TO RELATED APPLICATIONS

The present application is a U.S. National Phase Entry of International Application No. PCT/CN2020/085425 having an international filing date of Apr. 17, 2020, which claims the priority of Chinese patent application No. 201910448524.X, filed to the CNIPA on May 27, 2019 and entitled "Display Substrate and Preparation Method thereof, and Display Apparatus". The above-identified applications are incorporated into this application by reference in their entirety.

TECHNICAL FIELD

Embodiments of the present disclosure relate to, but are not limited to, the field of display technology, in particular to a display substrate and a preparation method thereof, and a display apparatus.

BACKGROUND

An Organic Light Emitting Diode (OLED) is an active light emitting display device, and has advantages of self-emission, wide viewing angle, high contrast, low power consumption, high response speed, etc. With continuous development of display technologies, OLED technologies are increasingly applied in various display apparatuses, e.g., in smart terminal products such as mobile phones and tablet computers.

For smart terminal products, most manufacturers are pursuing a higher screen-to-body ratio, e.g., a full screen and a borderless screen, intending to bring a dazzling visual impact to users. Since products such as smart terminals generally need to be equipped with hardware such as front cameras or light sensors, the solution of providing a mounting hole in an effective display area of an OLED display screen to receive hardware such as a camera is attracting great attention in the industry.

SUMMARY

The following is a summary of the subject matter described in detail herein. This summary is not intended to limit the protection scope of the claims.

Embodiments of the present disclosure provide a display substrate and a preparation method thereof, and a display apparatus.

In one aspect, an embodiment of the present disclosure provides a display substrate, including a display area, a mounting hole located in the display area, and an encapsulation region located between the display area and the mounting hole, wherein:

the encapsulation region includes an insulating layer, an encapsulation pixel definition layer arranged on the insulating layer, and a partition structure layer arranged on the encapsulation pixel definition layer, the encapsulation pixel definition layer includes multiple spaced protrusions, the partition structure layer includes multiple spaced columns, the columns are arranged on the protrusions, a functional layer is arranged on the multiple spaced columns, and the functional layer is broken by the columns.

In an exemplary embodiment, the encapsulation region is further provided with a filling layer wrapping the partition structure layer.

In an exemplary embodiment, the display area includes a driving structure layer and a display pixel definition layer defining a pixel opening area, and the display pixel definition layer in the display area and the encapsulation pixel definition layer in the encapsulation region are arranged on the same layer and made of the same material.

In an exemplary embodiment, in a plane perpendicular to a base substrate, in a section of the protrusion, a width of an end of the protrusion away from the base substrate is smaller than a width of an end of the protrusion close to the base substrate; and in a section of the column, a width of an end of the column away from the base substrate is larger than a width of an end of the column close to the base substrate.

In an exemplary embodiment, a width of an end of the column close to the base substrate is equal to a width of an end of the protrusion away from the base substrate.

In an exemplary embodiment, on a plane perpendicular to the base substrate, a shape of a section of the protrusion includes a trapezoid, and a shape of a section of the column includes an inverted trapezoid.

In an exemplary embodiment, on a plane perpendicular to the base substrate, a side wall of the trapezoid is an arc protruding outward, and a surface of the encapsulation pixel definition layer between adjacent trapezoids is an arc protruding toward the base substrate.

In an exemplary embodiment, a material of the partition structure layer includes a negative resist, and a material of the filling layer includes an organic material.

In an exemplary embodiment, the functional layer includes an organic light emitting layer and/or a cathode.

In another aspect, an embodiment of the present disclosure further provides a display apparatus, including the aforementioned display substrate.

In a further aspect, an embodiment of the present disclosure further provides a method for preparing a display substrate, the display substrate including a display area, a mounting hole located in the display area, and an encapsulation region located between the display area and the mounting hole, the method includes:

forming, in the encapsulation region, an insulating layer arranged on a base substrate and an encapsulation pixel definition layer arranged on the insulating layer, the encapsulation pixel definition layer including multiple spaced protrusions;

forming a partition structure layer on the encapsulation pixel definition layer, the partition structure layer including multiple spaced columns, and the columns being arranged on the protrusions; and forming a functional layer, the functional layer in the encapsulation region being broken by the multiple spaced columns.

In an exemplary embodiment, after forming the functional layer, the method further includes: forming, in the encapsulation region, a filling layer wrapping the partition structure layer.

In an exemplary embodiment, the method further includes: forming, in the display area, a driving structure layer arranged on the base substrate and a display pixel definition layer defining a pixel opening area, the display pixel definition layer in the display area and the encapsulation pixel definition layer in the encapsulation region being arranged on the same layer, made of the same material, and formed by the same process.

In an exemplary embodiment, in a plane perpendicular to the base substrate, in a section of the protrusion, a width of an end of the protrusion away from the base substrate is smaller than a width of an end of the protrusion close to the base substrate; and in a section of the column, a width of an end of the column away from the base substrate is larger than a width of an end of the column close to the base substrate.

In an exemplary embodiment, a width of an end of the column close to the base substrate is equal to a width of an end of the protrusion away from the base substrate.

In an exemplary embodiment, on a plane perpendicular to the base substrate, a shape of a section of the protrusion includes a trapezoid, and a shape of a section of the column includes an inverted trapezoid.

In an exemplary embodiment, on a plane perpendicular to the base substrate, a side wall of the trapezoid is an arc protruding outward, and a surface of the encapsulation pixel definition layer between adjacent trapezoids is an arc protruding toward the base substrate.

In an exemplary embodiment, a material of the partition structure layer includes a negative resist, and a material of the filling layer includes an organic material.

In an exemplary embodiment, the functional layer includes an organic light emitting layer and/or a cathode.

Other aspects will become apparent upon reading and understanding accompanying drawings and the detailed description.

BRIEF DESCRIPTION OF DRAWINGS

Together with the embodiments of the present disclosure, the accompanying drawings are used to explain the technical solution of the present disclosure, but do not constitute a limitation on the technical solution of the present disclosure. The shapes and dimensions of the components in the drawings do not reflect real proportions, but are only for the purpose of schematically illustrating the contents of the embodiments of the present disclosure.

Figure 1:
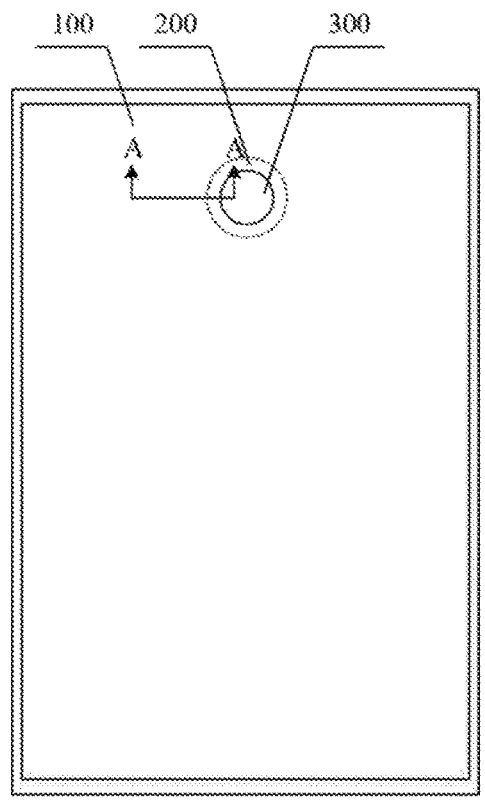
FIG. 1 is a schematic diagram of a structure of a display substrate according to an embodiment of the present disclosure.

Illustration of reference signs:
10—base substrate; 11—buffer layer; 12—active layer; 13—first insulating layer; 14—first gate electrode; 15—second gate electrode; 16—second insulating layer; 17—capacitor electrode; 18—third insulating layer; 19—source electrode; 20—drain electrode; 21—fourth insulating layer; 31—anode; 32—display pixel definition layer; 33—organic light emitting layer; 34—cathode; 35—first inorganic layer; 36—organic layer; 37—second inorganic layer; 100—display area; 200—encapsulation region; 300—mounting hole; 101—thin film transistor; 201—insulating layer; 202—encapsulation pixel definition layer; 203—partition structure layer; and 204—filling layer.

DETAILED DESCRIPTION

The following embodiments are used to explain the present disclosure, but are not used to limit the scope of the present invention. The embodiments in the present disclosure and the features in the embodiments may be combined with each other arbitrarily if there is no conflict.

One of the difficulties of the solution of providing a mounting hole in the effective display area of an OLED display screen lies in the effectiveness of encapsulation. As the side wall of the mounting hole exposes the organic light emitting layer and the cathode, water and oxygen in the atmosphere can invade into the active display area along the organic light emitting layer, so that the organic light emitting layer in the active display area fails, resulting in poor display.

In the solution of providing a mounting hole in the effective display area of an OLED display screen, in order to ensure the effectiveness of the organic light emitting layer in the effective display area, one measure is to adopt patterning processes of the organic light emitting layer and the cathode, e.g., evaporating the organic light emitting layer and the cathode only in the effective display area by using a high-precision metal mask. Embodiments of the present disclosure provide a display substrate and a preparation method thereof, and a display apparatus, which do not need to use patterning processes for an organic light emitting layer and a cathode, and have the advantages of low design difficulty, low manufacturing cost, easy process realization, effective guarantee of encapsulation effectiveness and reliability, and the like.

A display substrate according to an embodiment of the present disclosure may include a display area, a mounting hole located in the display area, and an encapsulation region located between the display area and the mounting hole. The encapsulation region includes an insulating layer, an encapsulation pixel definition layer arranged on the insulating layer, and a partition structure layer arranged on the encapsulation pixel definition layer. The encapsulation pixel definition layer includes multiple spaced protrusions, the partition structure layer includes multiple spaced columns, and the columns are arranged on the protrusions. A functional layer is arranged on the multiple spaced columns. The functional layer is broken by the columns. The encapsulation region is used for blocking a path of water and oxygen invading into the display area from the mounting hole.

In an exemplary embodiment, on a plane parallel to the display substrate, the display area includes multiple light emitting units distributed in an array, each light emitting unit serves as a sub-pixel, and three light emitting units which emit light of different colors (such as red, green and blue) or four light emitting units which emit light of different colors (such as red, green, blue and white) constitute a pixel unit. On a plane perpendicular to the display substrate, the display area includes a base substrate, a driving structure layer arranged on the base substrate and a light emitting structure layer arranged on the driving structure layer. The driving structure layer mainly includes multiple Thin Film Transistors (TFT), and the light emitting structure layer may include an anode, an organic light emitting layer and a cathode. In an exemplary embodiment, the mounting hole includes at least one through hole or blind hole, the structural film layer and the base substrate in the through hole are removed, most of the structural film layer in the blind hole is removed, and the through hole or blind hole is used for the placement of corresponding hardware, such as a cameras or sensor. In an exemplary embodiment, on a plane parallel to the display substrate, the encapsulation region may be an annular area surrounding the through hole or blind hole, and the annular area is located between the display area and the mounting hole for blocking the path of water and oxygen invading into the display area from the mounting hole. On a plane perpendicular to the display substrate, the encapsulation region may include a base substrate, a partition structure layer arranged on the base substrate and a functional layer arranged on the partition structure layer. The functional layer includes an organic light emitting layer, or includes an organic light emitting layer and a cathode, or includes a cathode. The organic light emitting layer and the cathode on the partition structure layer are broken by the partition structure layer.

In an OLED display substrate in which a mounting hole is provided in a display area according to an exemplary embodiment of the present disclosure, an encapsulation pixel definition layer including multiple protrusions and a partition structure layer including multiple columns are formed in an encapsulation region around the mounting hole, and by breaking the functional layer (such as the organic light emitting layer and the cathode) of the encapsulation region, the path of water and oxygen invading into the functional layer in the display area from the mounting hole is completely blocked, and it may be ensured that an inorganic layer formed later can effectively fit side walls of the columns and side walls of the protrusions, which effectively ensures the effectiveness and reliability of encapsulation, and has the advantages of low design difficulty, low manufacturing cost, easy process realization, etc.

Figure 2:
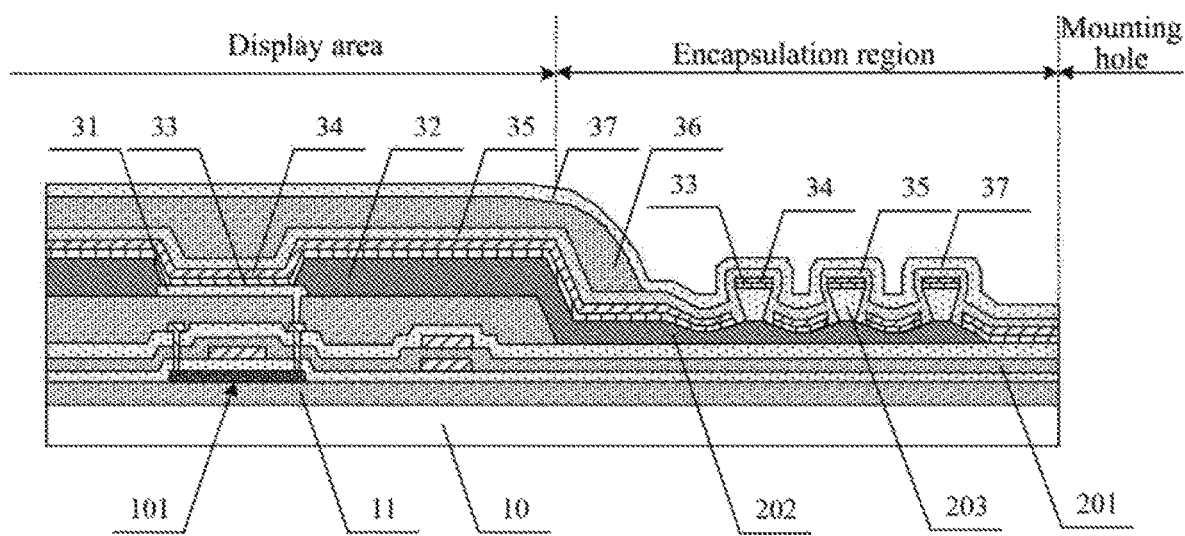
FIG. 2 is a sectional view taken in an A-A direction in FIG. 1.

FIG. 1 is a schematic diagram of a structure of a display substrate according to an exemplary embodiment. FIG. 2 is a sectional view taken in an A-A direction in FIG. 1, illustrating the structures of the display area, the encapsulation region and the mounting hole on a plane perpendicular to the display substrate. As shown in FIG. 1, on a plane parallel to the display substrate, the display substrate may include a display area 100, an encapsulation region 200 and a mounting hole 300. The mounting hole 300 is located in the display area 100, and the encapsulation region 200 is located between the display area 100 and the mounting hole 300, and may be an annular area surrounding the mounting hole 300. The position of the mounting hole 300 in the display area 100 is not restricted, and the shape of the mounting hole 300 is also not restricted, which may be a circle as shown in FIG. 1, or other polygons such as an ellipse, a square, or a rhombus.

On a plane perpendicular to the display substrate, the display area 100 includes multiple light emitting units distributed in an array. Each light emitting unit includes a driving structure layer and a light emitting structure layer arranged on the base substrate 10. The driving structure layer includes multiple thin film transistors. FIG. 2 merely illustrates one light emitting unit and one thin film transistor as an example. As shown in FIG. 2, the driving structure layer may include a buffer layer 11 arranged on the base substrate 10 and a thin film transistor 101 arranged on the buffer layer 11. The light emitting structure layer may include an anode 31 connected with a drain electrode of the thin film transistor 101, a first pixel definition layer 32 defining a pixel opening area, an organic light emitting layer 33 formed in the pixel opening area and on the first pixel definition layer 32, a cathode 34 formed on the organic light emitting layer 33, and an encapsulation layer. The encapsulation layer may include a first inorganic layer 35, an organic layer 36, and a second inorganic layer 37 that are stacked.

As shown in FIG. 2, on a plane perpendicular to the display substrate, the encapsulation region 200 may include a buffer layer 11 arranged on the base substrate 10, an insulating layer arranged on the buffer layer 11, an encapsulation pixel definition layer 202 arranged on the insulating layer, a partition structure layer 203 arranged on the encapsulation pixel definition layer 202, an organic light emitting layer 33 and a cathode 34 arranged on the partition structure layer 203 and broken by the partition structure layer 203, and a first inorganic layer 35 and a second inorganic layer 37 covering the above structure. The insulating layer arranged on the base substrate 10 may include a first insulating layer, a second insulating layer and a third insulating layer that are formed at the same time as the driving structure layer. The encapsulation pixel definition layer 202 arranged on the insulating layer and the first pixel definition layer 32 of the light emitting structure layer in the display area 100 may be arranged on the same layer, made of the same material, and formed by a single process. The partition structure layer 203 may be made of an organic material and may include multiple spaced columns. On a plane perpendicular to the base substrate 10, each column may have a shape that is wide in the upper part and narrow in the lower part, such as an inverted trapezoid.

As shown in FIG. 2, on a plane perpendicular to the display substrate, the mounting hole 300 is a through hole, and both the structural film layer and the base substrate in the through hole are removed.

In an exemplary embodiment, the display substrate may be prepared by the following preparation process. The "patterning process" in this embodiment includes, but is not limited to, film layer deposition, coating of photoresist, mask exposure, development, etching, stripping of photoresist, and other treatments. The "photolithography process" in this embodiment may include film layer coating, mask exposure, development, and other treatments.

FIGS. 3 to 13 are schematic diagrams showing a preparation process of a display substrate according to this embodiment. The preparation process of the display substrate includes the following (1)-(12).

Figure 3:
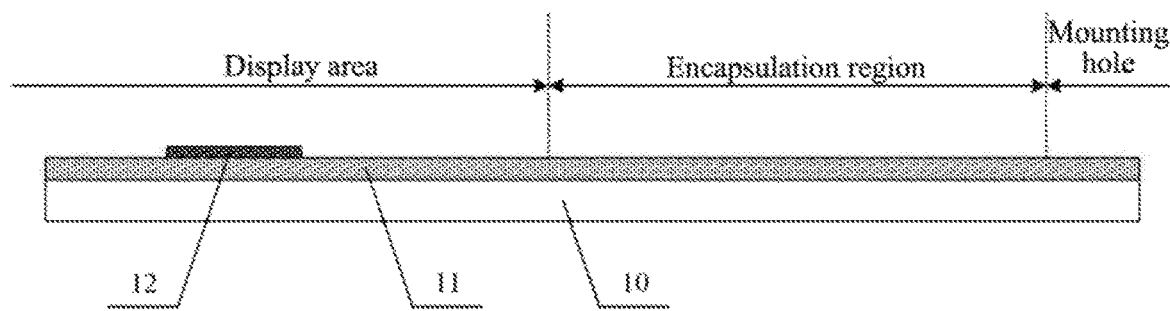
FIG. 3 is a schematic diagram of a structure after a pattern of an active layer is formed according to an embodiment of the present disclosure.

(1) Forming a pattern of an active layer on a base substrate 10. Forming a pattern of an active layer on a base substrate may include: first, depositing a layer of buffer thin film on the base substrate 10 to form a pattern of a buffer layer 11 covering the entire base substrate 10; and then depositing a layer of an active layer thin film, and patterning the active layer thin film by a patterning process to form, in the display area, a pattern of an active layer 12 arranged on the buffer layer 11, as shown in FIG. 3. The pattern of the active layer 12 is only formed in the display area, and at this time, only the buffer layer 11 is formed in the encapsulation region and at the mounting hole. The base substrate may be a flexible base substrate, which, for example, may be made of a material such as polyimide (PI), polyethylene terephthalate (PET), or a surface-treated polymer soft film. Silicon nitride (SiNx), silicon oxide (SiOx) or the like may be used for the buffer thin film, which may be a single layer structure or may be a multi-layer structure including silicon nitride and/or silicon oxide.

Figure 4:
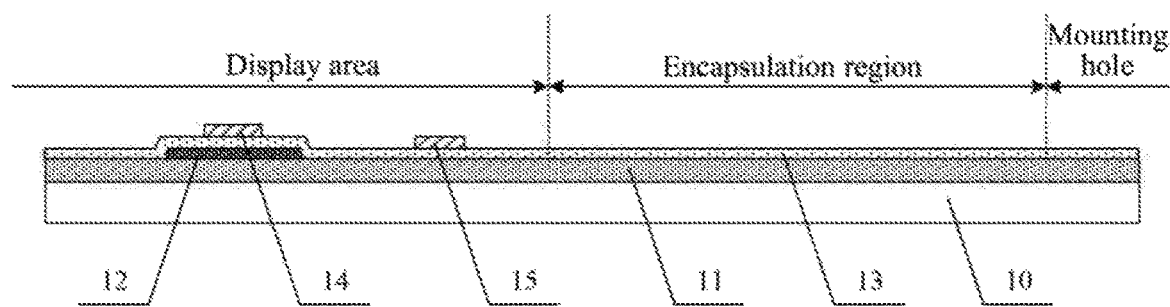
FIG. 4 is a schematic diagram of a structure after a pattern of a gate electrode is formed according to an embodiment of the present disclosure.

(2) Forming a pattern of a gate electrode. Forming a pattern of a gate electrode may include: sequentially depositing a first insulating thin film and a first metal thin film on the base substrate 10 on which the above structure is formed, and patterning the first metal thin film by a patterning process to form a pattern of a first insulating layer 13 covering the active layer 12 and the buffer layer 11, and a pattern of a first gate electrode 14, a pattern of a second gate electrode 15 and a pattern of a gate line (not shown) arranged on the first insulating layer 13, as shown in FIG. 4. The first gate electrode 14, the second gate electrode 15 and the gate line are only formed in the display area, and at this time, the buffer layer 11 and the first insulating layer 13 are formed in the encapsulation region and at the mounting hole.

Figure 5:
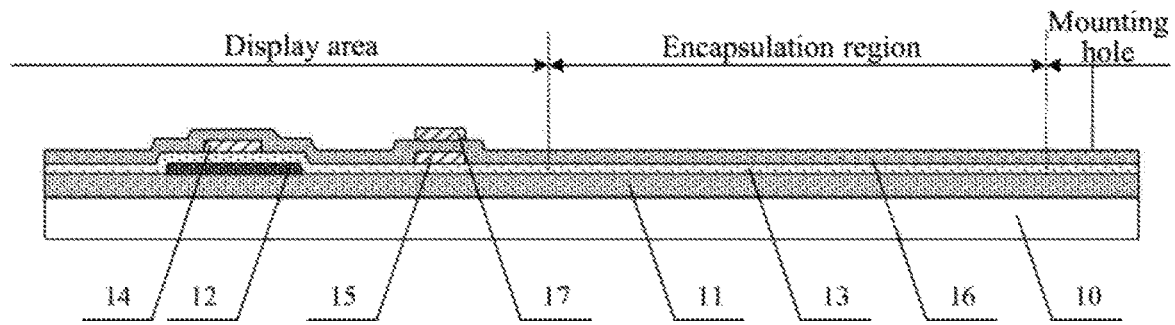
FIG. 5 is a schematic diagram of a structure after a pattern of a capacitor electrode is formed according to an embodiment of the present disclosure.

(3) Forming a pattern of a capacitor electrode. Forming a pattern of a capacitor electrode may include: sequentially depositing a second insulating thin film and a second metal thin film on the base substrate 10 on which the above structure is formed, and patterning the second metal thin film by a patterning process to form a pattern of a second insulating layer 16 covering the first gate electrode 14, the second gate electrode 15 and the first insulating layer 13, and a pattern of a capacitor electrode 17 arranged on the second insulating layer 16, wherein a position of the capacitor electrode 17 corresponds to a position of the second gate electrode 15, and the capacitor electrode 17 and the second gate electrode 15 constitute a capacitor, as shown in FIG. 5. The capacitor electrode 17 is only formed in the display area, and at this time, the buffer layer 11, the first insulating layer 13 and the second insulating layer 16 are formed in the encapsulation region and at the mounting hole.

Figure 6:
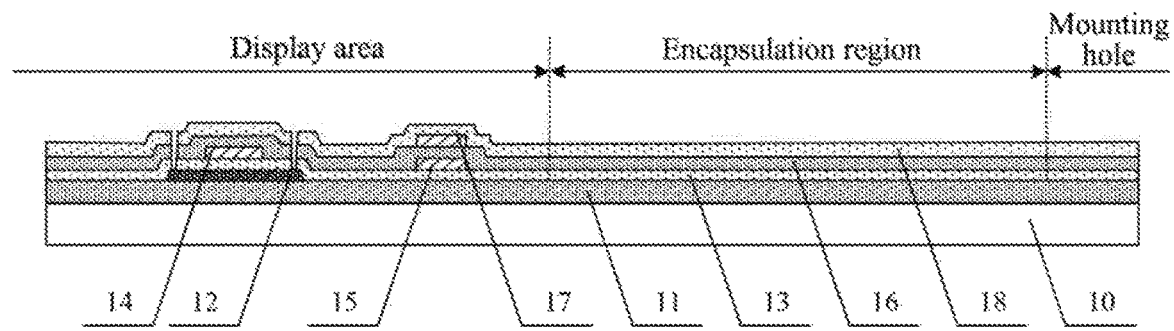
FIG. 6 is a schematic diagram of a structure after a pattern of a third insulating layer is formed according to an embodiment of the present disclosure.

(4) Forming a pattern of a third insulating layer provided with via holes. Forming a pattern of a third insulating layer provided with via holes may include: depositing a third insulating thin film on the base substrate 10 on which the above structure is formed, patterning the third insulating thin film by a patterning process to form a pattern of a third insulating layer 18 provided with two first via holes in the display area, and etching away the third insulating layer 18, the second insulating layer 16 and the first insulating layer 13 in the two first via holes to expose the active layer 12, as shown in FIG. 6. The two first via holes are only formed in the display area, and at this time, the buffer layer 11, the first insulating layer 13, the second insulating layer 16 and the third insulating layer 18 are formed in the encapsulation region and at the mounting hole.

Figure 7:
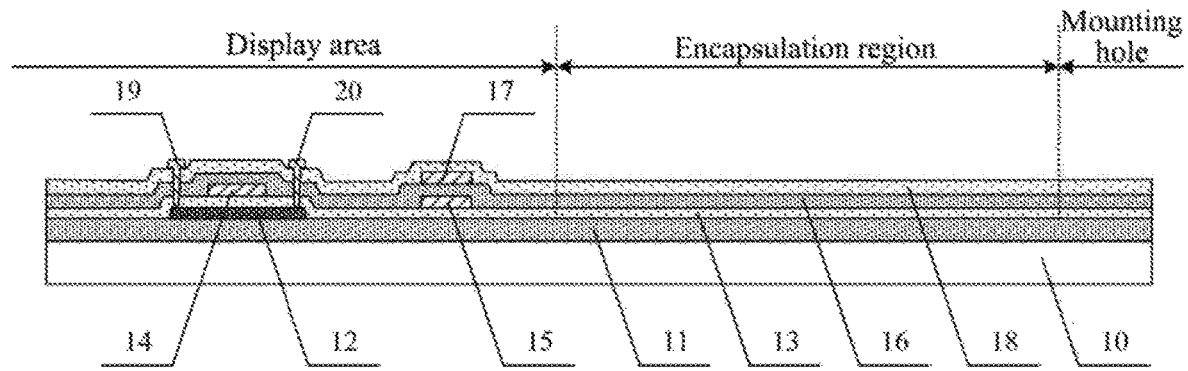
FIG. 7 is a schematic diagram of a structure after patterns of a source electrode and a drain electrode are formed according to an embodiment of the present disclosure.

(5) Forming patterns of a source electrode and a drain electrode. Forming patterns of a source electrode and a drain electrode may include: depositing a third metal thin film on the base substrate 10 on which the above structure is formed, and patterning the third metal thin film by a patterning process to form a pattern of a source electrode 19, a pattern of a drain electrode 20 and a pattern of a data line (not shown) in the display area, wherein the source electrode 19 and the drain electrode 20 are connected with the active layer 12 through the two first via holes, respectively, as shown in FIG. 7. The source electrode 19, the drain electrode 20 and the data line are only formed in the display area, and at this time, the buffer layer 11, the first insulating layer 13, the second insulating layer 16 and the third insulating layer 18 are formed in the encapsulation region and at the mounting hole.

By the above processes, the driving structure layer located in the display area and the insulating layer located in the encapsulation region and the mounting hole are prepared on the base substrate 10. The driving structure layer in the display area includes the active layer 12, the first gate electrode 14, the second gate electrode 15, the capacitor electrode 17, the source electrode 19, the drain electrode 20, the gate line and the data line. Gate lines and data lines cross vertically to define sub-pixels, and a thin film transistor composed of the active layer 12, the first gate electrode 14, the source electrode 19 and the drain electrode 20 is arranged in a sub-pixel. The insulating layer located in the encapsulation region and the mounting hole includes the first insulating layer 13, the second insulating layer 16 and the third insulating layer 18. The first insulating layer and the second insulating layer are also called a gate insulating layer (GI), and the third insulating layer is also called Interlayer Dielectric (ILD).

Figure 8:
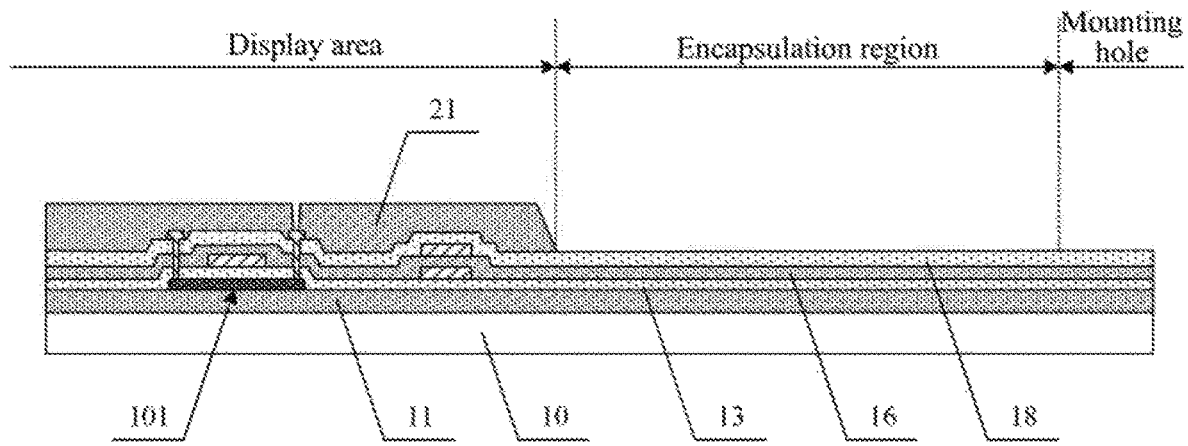
FIG. 8 is a schematic diagram of a structure after a pattern of a planarization layer is formed according to an embodiment of the present disclosure.

(6) Forming a pattern of a planarization layer. Forming a pattern of a planarization layer may include: coating a fourth insulating thin film onto the base substrate on which the above patterns are formed, and forming a pattern of a fourth insulating layer 21 covering the source electrode 19 and the drain electrode 20 in the display area by a photolithography process of mask exposure and development, wherein the fourth insulating layer 21 is provided with a second via hole exposing the drain electrode 20, as shown in FIG. 8. The fourth insulating layer 21 is only formed in the display area, and the fourth insulating thin film in the encapsulation region and the mounting hole is developed off. At this time, the buffer layer 11, the first insulating layer 13, the second insulating layer 16 and the third insulating layer 18 are formed in the encapsulation region and at the mounting hole. The fourth insulating layer is also called a planarization layer (PLN).

Figure 9:
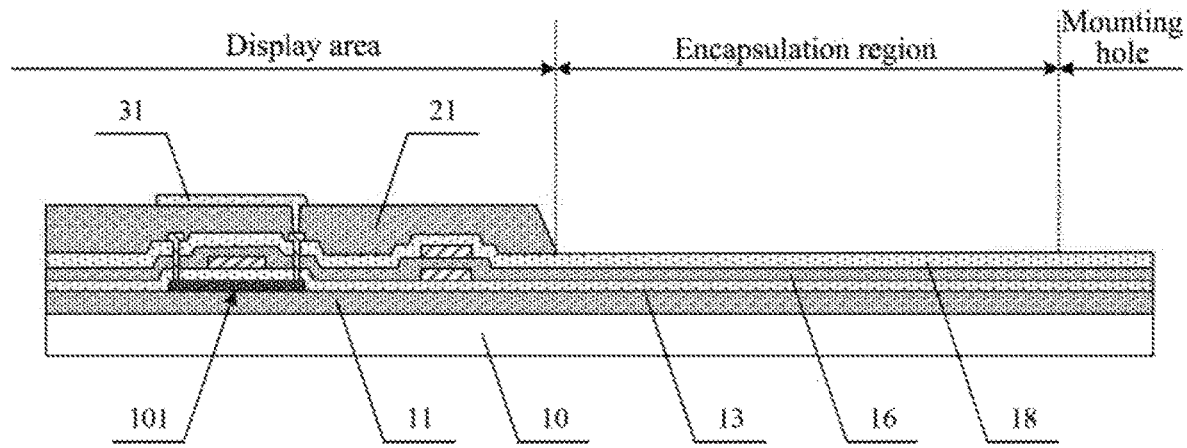
FIG. 9 is a schematic diagram of a structure after a pattern of an anode is formed according to an embodiment of the present disclosure.

(7) Forming a pattern of an anode. Forming a pattern of an anode may include: depositing a transparent conductive thin film on the base substrate on which the above patterns are formed, and patterning the transparent conductive thin film by a patterning process to form a pattern of an anode 31 in the display area, wherein the anode 31 is connected to the drain electrode 20 through the second via hole, as shown in FIG. 9. The anode 31 is only formed in the display area, and the transparent conductive thin film in the encapsulation region and the mounting hole is etched away. At this time, the buffer layer 11, the first insulating layer 13, the second insulating layer 16 and the third insulating layer 18 are formed in the encapsulation region and at the mounting hole. The transparent conductive thin film may be made of indium tin oxide (ITO) or indium zinc oxide (IZO).

Figure 10:
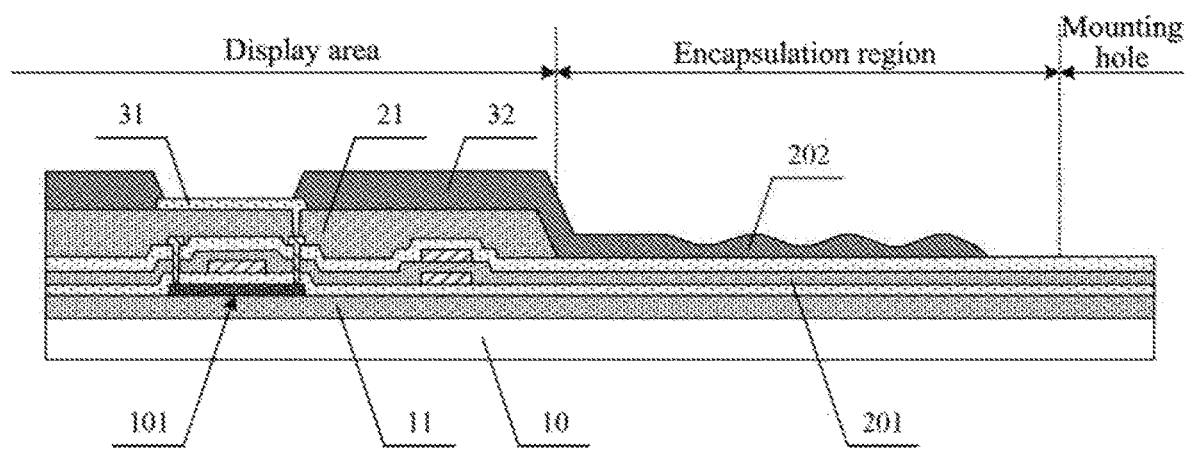
FIG. 10 is a schematic diagram of a structure after a pattern of a pixel definition layer is formed according to an embodiment of the present disclosure.

(8) Forming a pattern of a pixel definition layer. Forming a pattern of a pixel definition layer may include: coating a pixel definition thin film onto the base substrate on which the above patterns are formed, and forming a pattern of a Pixel Definition Layer by a photolithography process. The pixel definition layer includes a pattern of a display pixel definition layer 32 located in the display area and a pattern of an encapsulation pixel definition layer 202 located in the encapsulation region. That is, the pattern of the display pixel definition layer 32 and the pattern of the encapsulation pixel definition layer 202 may be formed by a same photolithography process, and they are arranged on the same layer and made of the same material. The display pixel definition layer 32 defines, in each sub-pixel, a pixel opening area exposing the anode 31, and the encapsulation pixel definition layer 202 is arranged on the third insulating layer 18, as shown in FIG. 10. The display pixel definition layer 32 is formed in the display area, and the encapsulation pixel definition layer 202 is formed in the encapsulation region. The pixel definition thin film of the mounting hole is developed off. At this time, the buffer layer 11, the insulating layer 201 composed of the first insulating layer 13, the second insulating layer 16 and the third insulating layer 18, and the encapsulation pixel definition layer 202 are formed in the encapsulation region, and the buffer layer 11 and the insulating layer 201 are formed at the mounting hole. Herein, polyimide, acrylic, polyethylene terephthalate or the like may be used in the pixel definition layer.

In this process, the encapsulation pixel definition layer 202 formed in the encapsulation region includes multiple spaced protrusions. On a plane perpendicular to the base substrate, a shape of a section of each protrusion has a characteristic of being narrow in the upper part and wide in the lower part, that is, a width of one end (an upper end) of the protrusion away from the base substrate 10 is smaller than a width of one end (a lower end) of the protrusion close to the base substrate 10. In other words, the encapsulation pixel definition layer 202 is formed with multiple spaced dimples, and protrusions are formed between adjacent dimples. Optionally, on a plane perpendicular to the base substrate 10, a shape of a section of each protrusion is a trapezoid. The multiple protrusions formed in the encapsulation region in this process can help to improve the encapsulation effect of an encapsulation layer formed later.

Figure 11:
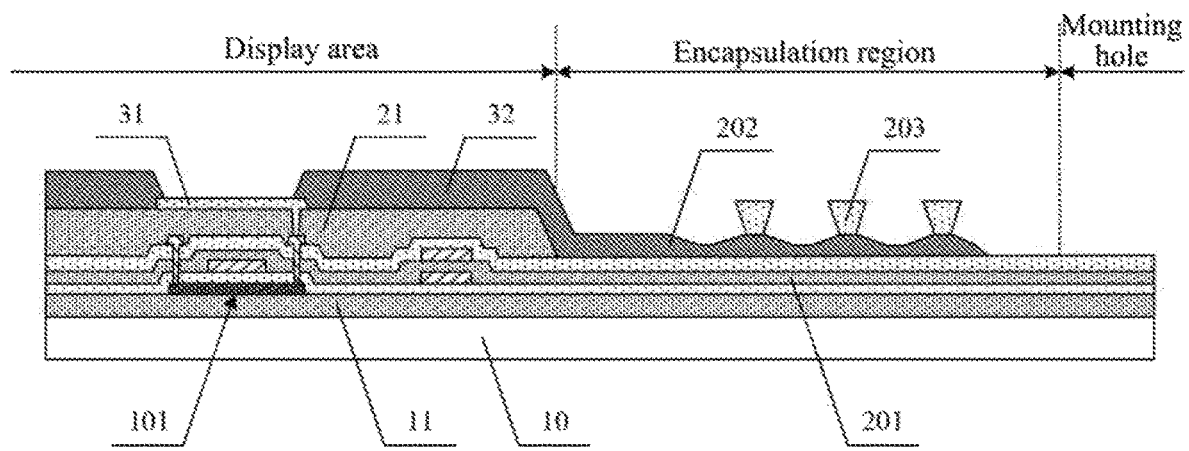
FIG. 11 is a schematic diagram of a structure after a pattern of a partition structure layer is formed according to an embodiment of the present disclosure.

(9) Forming a pattern of a partition structure layer. Forming a pattern of a partition structure layer may include: coating a layer of an organic thin film onto the base substrate on which the above patterns are formed, and forming, in the encapsulation region, a pattern of a partition structure layer 203 by a photolithography process. The partition structure layer 203 includes multiple spaced columns. On a plane parallel to the base substrate 10, a shape of a section of each column may be a rectangle, a circle, an ellipse or the like. On a plane perpendicular to the base substrate 10, a shape of a section of each column may have a characteristic of being wide in the upper part and narrow in the lower part, that is, a width of one end (an upper end) of the column away from the base substrate 10 is larger than a width of one end (a lower end) of the column close to the base substrate 10, as shown in FIG. 11. Optionally, on a plane perpendicular to the base substrate 10, a shape of a section of each column is an inverted trapezoid. The partition structure layer 203 is only formed in the encapsulation region, and the organic thin film in the display area and the mounting hole is developed off. In this embodiment, the arrangement of the multiple spaced columns in an inverted trapezoid may serve to partition off an organic light emitting layer and a cathode evaporated later in the encapsulation region, thereby blocking the path of water and oxygen invading into the display area from the mounting hole. In an exemplary embodiment, a negative resist may be used for the partition structure layer 203.

In this process, the column formed in the encapsulation region is arranged at an upper end (the end away from the base substrate 10) of the protrusion of the encapsulation pixel definition layer 202. On a plane parallel to the base substrate 10, a width of a lower end (the end close to the base substrate 10) of the column may be the same as a width of an upper end (the end away from the base substrate 10) of the protrusion, that is, the widths of contact surfaces of the column and the protrusion are the same. In this process, the columns are arranged on the protrusions, which can help to ensure that an encapsulation layer formed later fits the side walls of the columns, and improve the encapsulation effect.

Figure 12:
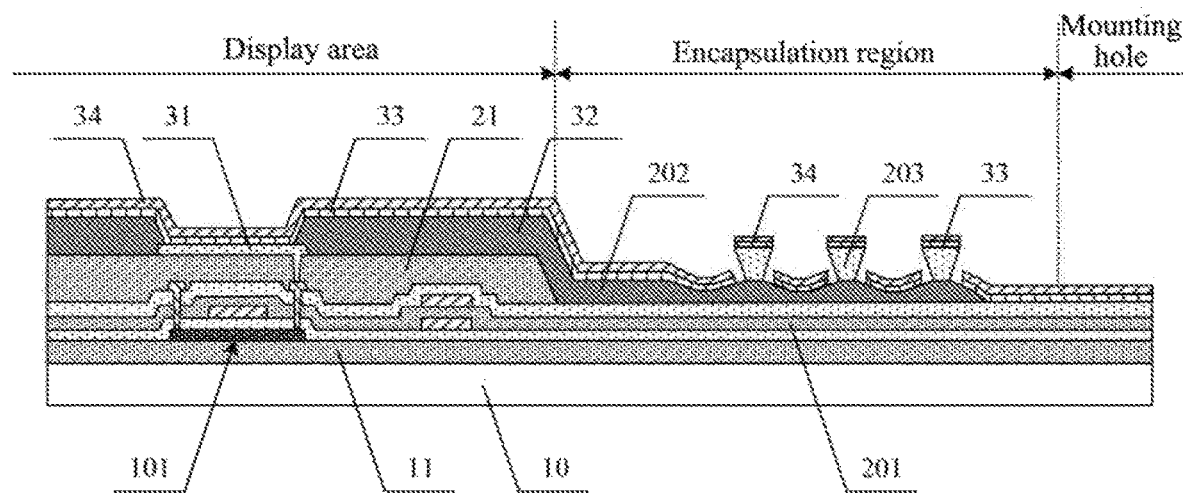
FIG. 12 is a schematic diagram of a structure after patterns of an organic light emitting layer and a cathode are formed according to an embodiment of the present disclosure.

(10) Forming patterns of an organic light emitting layer and a cathode. Forming patterns of an organic light emitting layer and a cathode may include: sequentially evaporating an organic light emitting material and a cathode metal thin film on the base substrate on which the above patterns are formed, to form a pattern of an organic light emitting layer 33 and a pattern of a cathode 34. In the display area, the organic light emitting layer 33 is connected to the anode 31 in the pixel opening area defined by the display pixel definition layer 32, and the cathode 34 is arranged on the organic light emitting layer 33. In the encapsulation region, since the partition structure layer 203 is arranged in this area, the multiple columns of the partition structure layer 203 having the characteristic of being wide in the upper part and narrow in the lower part break the organic light emitting layer 33 and the cathode 34 at the side walls of the columns, with part of the organic light emitting layer 33 and the cathode 34 being located at the upper ends of the columns, and the other part of the organic light emitting layer 33 and the cathode 34 being located on the encapsulation pixel definition layer 202 between the columns, so that the organic light emitting layer 33 and the cathode 34 in the encapsulation region are completely partitioned off, thereby partitioning off the organic light emitting layer and the cathode between the display area and the mounting hole, thereby preventing water and oxygen around the mounting hole from entering the display area along the organic light emitting layer, and prolonging the service life of the device. At the mounting hole, the organic light emitting layer 33 and the cathode 34 are formed on the insulating layer 201, as shown in FIG. 12. The organic light emitting layer 33 may include an emitting layer (EML). In an exemplary embodiment, the organic light emitting layer may include a hole injection layer, a hole transporting layer, an emitting layer, an electron transporting layer, and an electron injection layer disposed in turn to improve the efficiency of injecting electrons and holes into the emitting layer. The cathode may be made of any one of metal materials such as magnesium (Mg), argentum (Ag), aluminum (Al), copper (Cu), and lithium (Li), or an alloy formed of one or more of the above metals.

Figure 13:
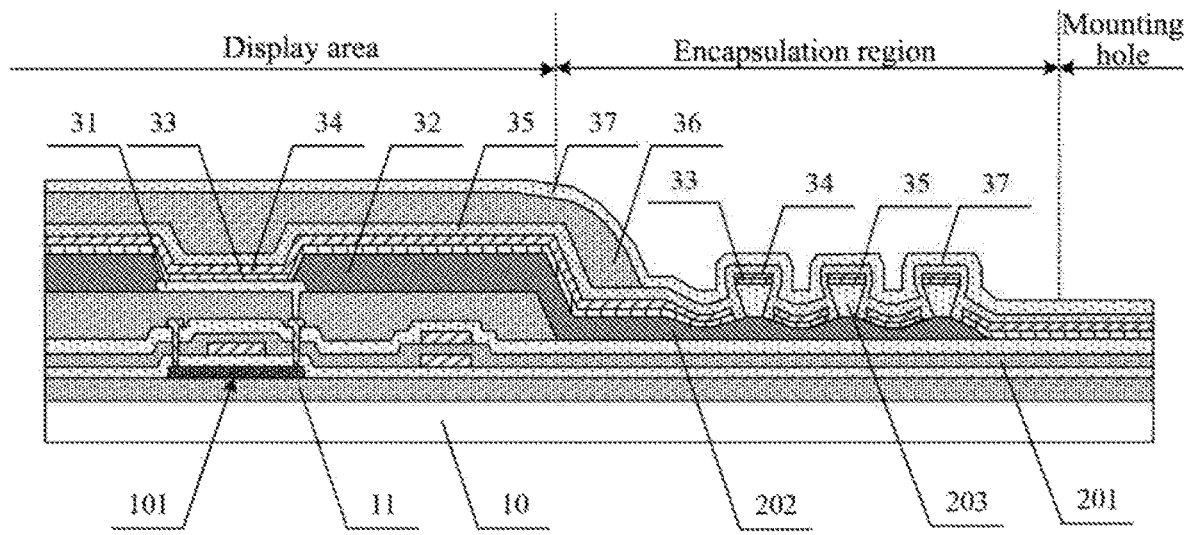
FIG. 13 is a schematic diagram of a structure after a pattern of an encapsulation layer is formed according to an embodiment of the present disclosure.

(11) Forming a pattern of an encapsulation layer. Forming a pattern of an encapsulation layer may include: first, depositing a first inorganic thin film on the base substrate on which the above patterns are formed, wherein the first inorganic thin film covers the display area, the encapsulation region and the mounting hole, to form a pattern of a first inorganic layer 35; next, forming an organic layer 36 in the display area by inkjet printing; and then, depositing a second inorganic thin film, wherein the second inorganic thin film covers the display area, the encapsulation region and the mounting hole, to form a pattern of a second inorganic layer 37, as shown in FIG. 13. The encapsulation layer is an inorganic/organic/inorganic three-layer structure, the intermediate organic layer is formed only in the display area, and the upper and lower inorganic layers cover the display area, the encapsulation region and the mounting hole, to complete encapsulation of the display substrate.

Through the above process, the preparation of the light emitting structure layer located in the display area and the partition structure layer located in the encapsulation region is completed. The light emitting structure layer in the display area includes the anode 31, the first pixel definition layer 32, the organic light emitting layer 33, the cathode 34 and the encapsulation layer.

Figure 14:
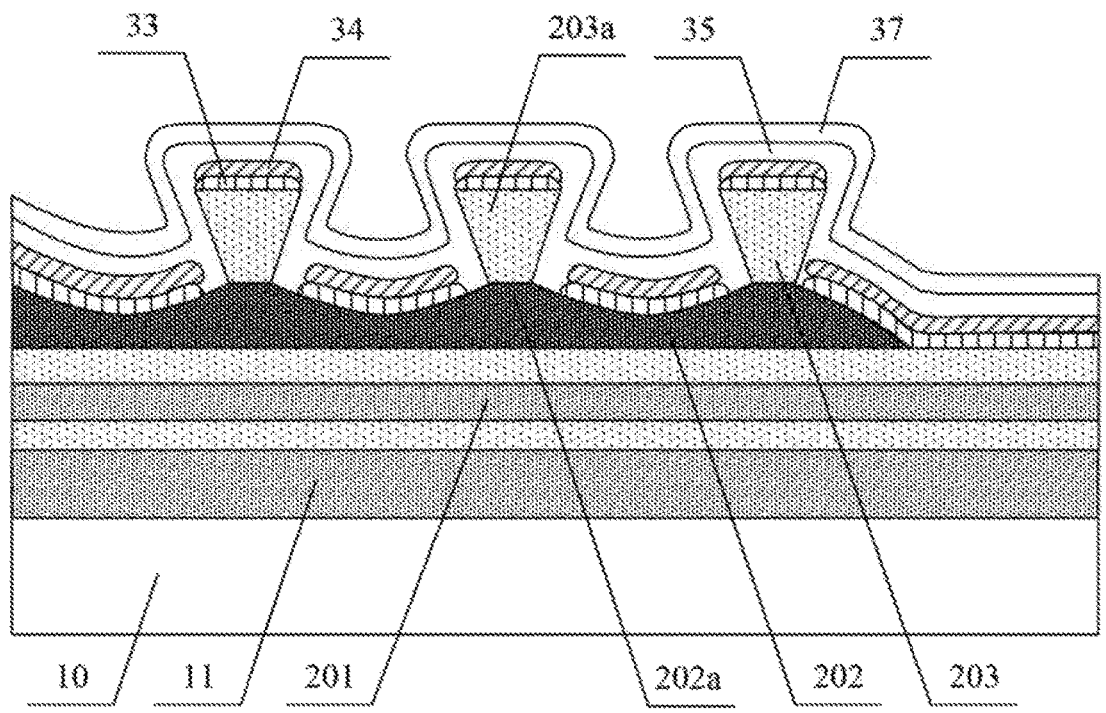
FIG. 14 is an enlarged view of an encapsulation region in FIG. 13.
Figure 15:
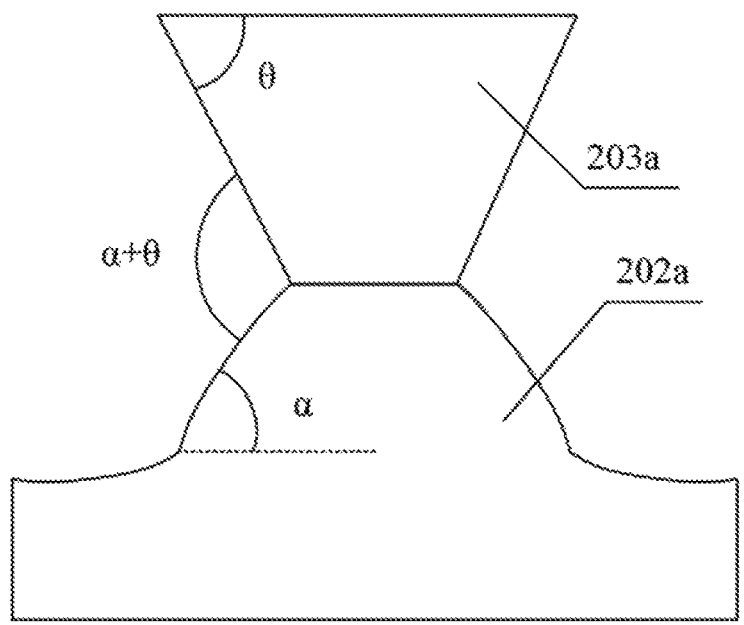
FIG. 15 is an enlarged view of a partition structure layer in FIG. 14.

FIG. 14 is an enlarged view of the encapsulation region in FIG. 13, and FIG. 15 is an enlarged view of the partition structure layer in FIG. 14. As shown in FIG. 14, in the encapsulation region, the buffer layer 11, the insulating layer 201 composed of the first insulating layer, the second insulating layer and the third insulating layer, the encapsulation pixel definition layer 202, the partition structure layer 203, the organic light emitting layer 33, the cathode 34, the first inorganic layer 35 and the second inorganic layer 37 are sequentially formed on the base substrate 10. The encapsulation pixel definition layer 202 and the display pixel definition layer 32 in the light emitting structure layer in the display area are formed by a single process, and they are arranged on the same layer and made of the same material. An upper surface of the encapsulation pixel definition layer 202 is dentate or wave-shaped, and formed with multiple spaced protrusions 202a. The partition structure layer 203 includes multiple spaced columns 203a. The columns 203a are formed on the protrusions 202a. As the multiple columns 203a have the characteristic of being wide in the upper part and narrow in the lower part, the organic light emitting layer 33 and the cathode 34 which are evaporated later are broken at the side walls of the columns 203a, with part of the organic light emitting layer 33 and the cathode 34 being located at the upper ends of the columns 203a, and the other part of the organic light emitting layer 33 and the cathode 34 being located on the encapsulation pixel definition layer 202 between the columns 203a. Subsequently, the first inorganic layer 35 and the second inorganic layer 37 cover the above structure.

As shown in FIG. 15, on a plane perpendicular to the base substrate, a shape of a section of the protrusion 202a is a trapezoid in which an angle α between a side wall and a lower line can be 30 to 80 degrees. A shape of a section of the column 203a is an inverted trapezoid in which an angle θ between a side wall and an upper line can be 30 to 80 degrees. A lower base of the column 203a is arranged on an upper base of the protrusion 202a. A width of the lower base of the column 203a may be the same as that of the upper base of the protrusion 202a, so that an angle of α+θ can be formed between a side wall of the column 203a and a side wall of the protrusion 202a. If the upper surface of the encapsulation pixel definition layer 202 is a flat surface parallel to the base substrate 10, when the column 203a is disposed on the encapsulation pixel definition layer 202, an angle between a side wall of the inverted trapezoidal column 203a and the upper surface of the encapsulation pixel definition layer 202 is θ. Since the angle is relatively small, the first inorganic layer and the second inorganic layer formed later may not be able to fit the side wall of the column 203a, resulting in defects in corner areas of the encapsulation layer formed on the side wall of the column 203a and the surface of the encapsulation pixel definition layer 202, which affects the encapsulation effect. In an embodiment of the present disclosure, multiple spaced trapezoidal protrusions 202a are formed on the upper surface of the encapsulation pixel definition layer 202, when the columns 203a are arranged on the protrusions 202a, the angle between the side wall of the inverted trapezoidal column 203a and the upper surface of the encapsulation pixel definition layer 202 is α+θ. By increasing the angle, it may be ensured that the first inorganic layer and the second inorganic layer formed later can effectively fit the side walls of the columns 203a and the side walls of the protrusions 202a, thereby eliminating the encapsulation defects and enhancing the encapsulation effect. Therefore, the structure of this embodiment not only can effectively partition off the organic light emitting layer and the cathode, but also can ensure the thin film encapsulation effect in a later stage, preventing the encapsulation problem of the thin film encapsulation at the bottom of the inverted trapezoidal structure due to an excessively small angle, extending the encapsulation distance of the encapsulation region, and greatly improving the service life of the device.

In order to improve effective fitting of the first inorganic layer and the second inorganic layer formed later, on a plane perpendicular to the base substrate, the upper surface of the encapsulation pixel definition layer 202 may be wave-shaped, with the protrusions 202a being peaks and parts between adjacent protrusions 202a being troughs. For example, a shape of a section of the protrusion 202a may be trapezoid-like, that is, the two side walls of the protrusion 202a are set as arcs protruding outward (the "protruding outward" means protruding toward the outer side of the trapezoid), and the upper surface of the encapsulation pixel definition layer 202 between adjacent protrusions 202a is optimized as an arc protruding toward the base substrate (i.e., concave shape), so that a continuous curve is formed by the upper surface of the encapsulation pixel definition layer 202 and the side walls of the protrusions 202a.

(12) Finally, all or part of the structural film layer and the base substrate of the mounting hole are etched away by laser and other related processes to form an OLED display substrate provided with a mounting hole, as shown in FIG. 2. In an exemplary embodiment, all the structural film layer and the base substrate in the mounting hole may be etched away to form a through hole, or part of the structural film layer of the mounting hole may be etched away to form a blind hole, which is determined according to actual needs and is not restricted in the embodiments of the present disclosure.

It can be seen from the above preparation process that in the display substrate provided by an exemplary embodiment of the present disclosure, a partition structure layer including multiple columns is arranged in the encapsulation region, and the multiple columns break the organic light emitting layer and the cathode at the side walls of the columns, partitioning off the organic light emitting layer and the cathode in the encapsulation region, thus blocking the path of water and oxygen invading from the mounting hole into the organic light emitting layer and the cathode in the display area. In addition, in an exemplary embodiment of the present disclosure, the encapsulation pixel definition layer is designed as multiple spaced protrusions on which the columns are arranged, and by increasing the angle between the side wall of the column and the surface of the encapsulation pixel definition layer, it may be ensured that the first inorganic layer and the second inorganic layer formed later can effectively fit the side walls of the columns and the side walls of the protrusions, eliminating the encapsulation defects and improving the encapsulation effect.

Since the solutions of the embodiments of the present disclosure do not employ patterning processes of an organic light emitting layer and a cathode, the design difficulty and the manufacturing cost are reduced, which provides the advantages of low design difficulty and low manufacturing cost. In addition, as the embodiments of the present disclosure have small improvements on the process and can be well compatible with the existing preparation process, the embodiments of the present disclosure are simple in process realization, are easy to implement, and has high production efficiency, and has the advantages of easy process implementation, low production cost, high yield, etc. In a word, the embodiments of the present disclosure effectively ensure the effectiveness and reliability of encapsulation, and have a good application prospect.

The structure and its preparation process shown in this embodiment are merely illustrative. In actual implementation, according to actual needs, corresponding structures may be changed and patterning processes may be added or reduced. For example, the OLED display substrate may be a top emission structure, or may be a bottom emission structure. In another example, the thin film transistor may be a top gate structure or a bottom gate structure, and may be a dual gate structure or a single gate structure. In a further example, the thin film transistor may be an amorphous silicon (a-Si) thin film transistor, a low-temperature poly-silicon (LTPS) thin film transistor or an Oxide thin film transistor, and other electrodes, leads and structural film layers may also be provided in the driving structure layer and the light emitting structure layer, which is not restricted here in the embodiments of the present disclosure.

Figure 16:
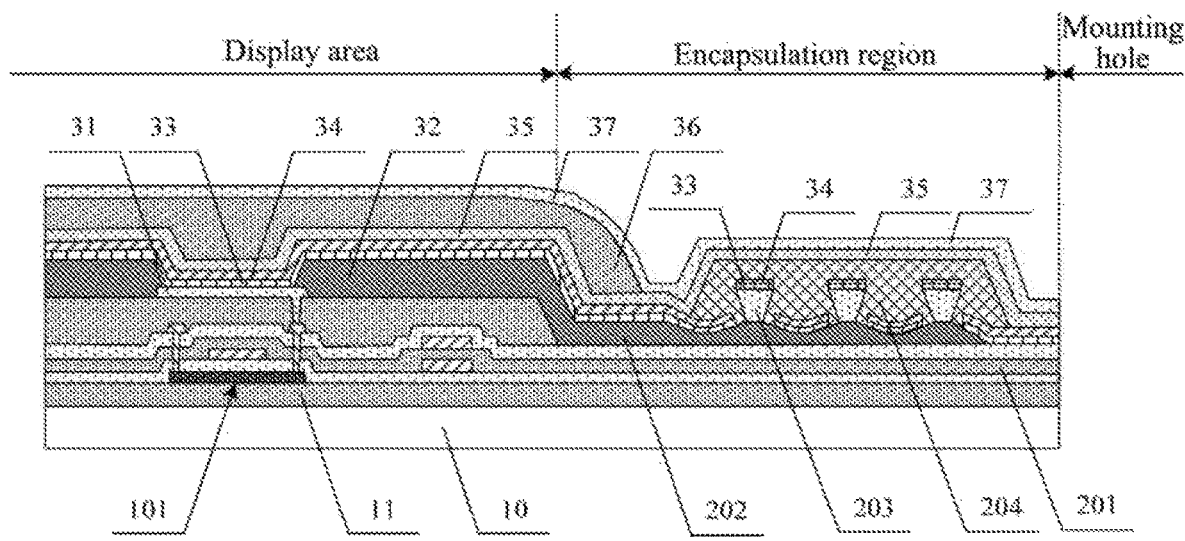
FIG. 16 is a schematic diagram of a structure of another display substrate according to an embodiment of the present disclosure.

FIG. 16 is a schematic diagram of a structure of a display substrate in another exemplary embodiment, illustrating the structures of a display area, an encapsulation region and a mounting hole on a plane perpendicular to the display substrate. In this exemplary embodiment, the display substrate is further provided with a filling layer. As shown in FIG. 16, on a plane parallel to the display substrate, the display substrate includes a display area 100, an encapsulation region 200 and a mounting hole 300. The mounting hole 300 is located in the display area 100, and the encapsulation region 200 is located between the display area 100 and the mounting hole 300 and is an annular area surrounding the mounting hole 300 in this embodiment. In this exemplary embodiment, on a plane perpendicular to the display substrate, the encapsulation region 200 includes a buffer layer 11 arranged on the base substrate 10, an insulating layer 201 arranged on the buffer layer 11, an encapsulation pixel definition layer 202 arranged on the insulating layer, a partition structure layer 203 arranged on the encapsulation pixel definition layer 202, an organic light emitting layer 33 and a cathode 34 arranged on the partition structure layer 203 and broken by the partition structure layer 203, a filling layer 204 covering the partition structure layer 203, and a first inorganic layer 35 and a second inorganic layer 37 arranged on the filling layer 204. The insulating layer 201 includes a first insulating layer, a second insulating layer and a third insulating layer formed at the same time as a driving structure layer. The encapsulation pixel definition layer 202 arranged on the insulating layer and the first pixel definition layer 32 of the light emitting structure layer in the display area 100 may be arranged on the same layer, made of the same material, and formed by a single process. The encapsulation pixel definition layer 202 includes multiple spaced protrusions, and on a plane perpendicular to the base substrate 10, a shape of a section of each protrusion may have a characteristic of being narrow in the upper part and wide in the lower part, such as a trapezoidal shape. The partition structure layer 203 may be made of an organic material, and includes multiple spaced columns. On a plane perpendicular to the base substrate 10, a section of each column is wide in the upper part and narrow in the lower part, such as an inverted trapezoidal shape. The columns are arranged on the protrusions. The multiple columns of the partition structure layer 203 having the characteristic of being wide in the upper part and narrow in the lower part break the organic light emitting layer 33 and the cathode 34 at the side walls of the columns, thus completely partitioning off the organic light emitting layer 33 and the cathode 34 in the encapsulation region. The filling layer 204 covers the multiple columns of the partition structure layer 203, fills the space between adjacent columns, and wraps the whole partition structure layer 203. The first inorganic layer 35 and the second inorganic layer 37 are disposed on the filling layer 204, the encapsulation of the display substrate is completed.

In this embodiment, the whole partition structure layer 203 is wrapped by the filling layer 204, so that the first inorganic layer 35 and the second inorganic layer 37 deposited later have a gentle coating path, which ensures good coverage at the inverted trapezoidal structure, can effectively prevent an encapsulation failure, and can increase the adhesive force of the inverted trapezoidal structure. The filling layer 204 may be made of an organic material and formed by means of inkjet printing, coating, screen printing, etc.

In this embodiment, the encapsulation pixel definition layer 202 includes multiple spaced protrusions, and on a plane perpendicular to the base substrate 10, a shape of a section of each protrusion has the characteristic of being narrow in the upper part and wide in the lower part. Optionally, the protrusion has a trapezoidal sectional shape. The partition structure layer 203 includes multiple spaced columns, and on a plane perpendicular to the base substrate 10, a shape of a section of each column has a characteristic of being wide in the upper part and narrow in the lower part. Optionally, the column has an inverted trapezoidal sectional shape. A lower base of the column is arranged on an upper base of the protrusion, and a width of the lower base of the column can be the same as that of the upper base of the protrusion, so that a relatively large angle can be formed between a side wall of the column and a side wall of the protrusion. By increasing the angle, it may be ensured that the filling layer 204 formed later can effectively fit the side walls of the columns and the side walls of the protrusions, which can effectively prevent an encapsulation failure.

In the preparation process of the display substrate in this exemplary embodiment, after the patterns of the organic light emitting layer and the cathode are formed, the filling layer 204 wrapping the whole partition structure layer 203 can be formed in the encapsulation region by means of inkjet printing, coating, screen printing or the like, and then the pattern of the encapsulation layer is formed.

Figure 17:
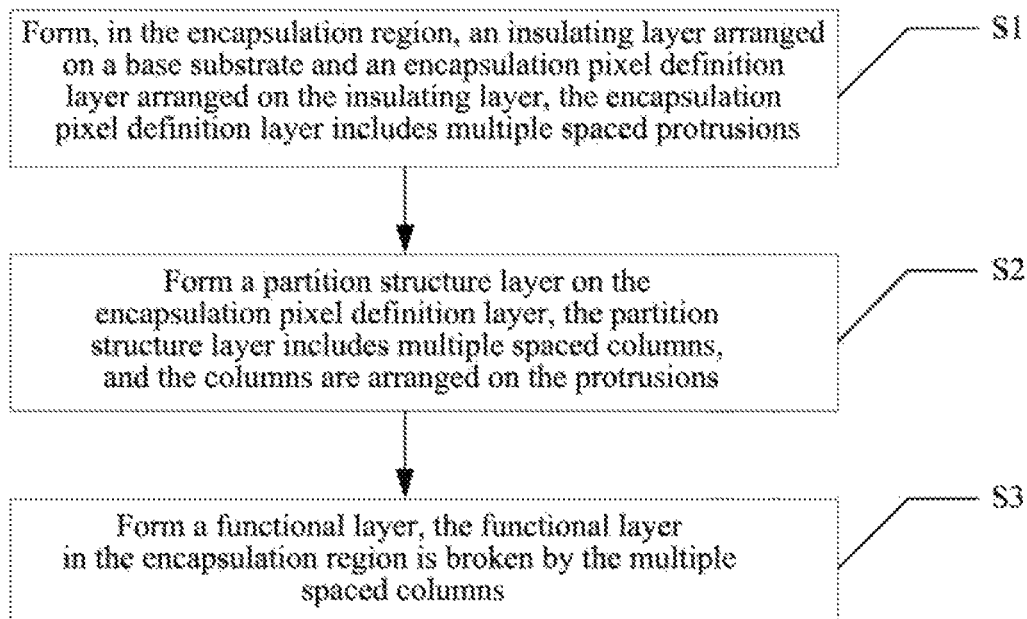
FIG. 17 is a flowchart of a method for preparing a display substrate according to an embodiment of the present disclosure.

In an exemplary embodiment, a method for preparing a display substrate is provided. The display substrate includes a display area, a mounting hole located in the display area, and an encapsulation region located between the display area and the mounting hole. As shown in FIG. 17, the method for preparing the display substrate according to an embodiment of the present disclosure includes:

S1, forming, in the encapsulation region, an insulating layer arranged on a base substrate and an encapsulation pixel definition layer arranged on the insulating layer, the encapsulation pixel definition layer including multiple spaced protrusions;

S2, forming a partition structure layer on the encapsulation pixel definition layer, the partition structure layer including multiple spaced columns, and the columns being arranged on the protrusions; and S3, forming a functional layer, the functional layer in the encapsulation region being broken by the multiple spaced columns.

In an exemplary embodiment, the functional layer includes an organic light emitting layer, or includes an organic light emitting layer and a cathode, or includes a cathode.

In an exemplary embodiment, after step S3, the method further includes: forming, in the encapsulation region, a filling layer wrapping the partition structure layer.

In an exemplary embodiment, the method further includes: forming, in the display area, a driving structure layer arranged on the base substrate and a display pixel definition layer defining a pixel opening area, the display pixel definition layer in the display area and the encapsulation pixel definition layer in the encapsulation region being arranged on the same layer, made of the same material, and formed by the same process.

In an exemplary embodiment, in a plane perpendicular to the base substrate, in a section of the protrusion, a width of an end of the protrusion away from the base substrate is smaller than a width of an end of the protrusion close to the base substrate; and in a section of the column, a width of an end of the column away from the base substrate is larger than a width of an end of the column close to the base substrate.

In an exemplary embodiment, on a plane perpendicular to the base substrate, a width of an end of the column close to the base substrate is equal to a width of an end of the protrusion away from the base substrate.

In an exemplary embodiment, on a plane perpendicular to the base substrate, a shape of a section of the protrusion includes a trapezoid, and a shape of a section of the column includes an inverted trapezoid.

In an exemplary embodiment, on a plane perpendicular to the base substrate, a side wall of the trapezoid is an arc protruding outward, and a surface of the encapsulation pixel definition layer between adjacent trapezoids is an arc protruding toward the base substrate.

In an exemplary embodiment, a material of the partition structure layer includes a negative resist, and a material of the filling layer includes an organic material.

In this embodiment, the structures, materials, relevant parameters and preparation processes of the above various film layers have been described in detail in the above embodiments, and will not be repeated here.

This embodiment provides a method for preparing a display substrate, in which by arranging, in the encapsulation region around the mounting hole, a partition structure layer for breaking the organic light emitting layer and the cathode in the encapsulation region, the path of water and oxygen invading from the mounting hole into the organic light emitting layer and the cathode in the display area is completely blocked, which effectively ensures the effectiveness and reliability of encapsulation, and has the advantages such as low design difficulty, low manufacturing cost, and easy process realization. Optionally, in an embodiment of the present disclosure, the encapsulation pixel definition layer is designed as multiple spaced protrusions, and by increasing the angle between the side wall of the column and the surface of the encapsulation pixel definition layer, it may be ensured that the first inorganic layer and the second inorganic layer formed later can effectively fit the side walls of the columns and the side walls of the protrusions, eliminating the encapsulation defects and improving the encapsulation effect. The preparation method of this embodiment has small improvements in process and can be well compatible with the existing preparation process, and therefore is simple in process realization, is easy to implement, and has high production efficiency, and has the advantages of easy process realization, low production cost, high yield and the like, effectively ensuring the effectiveness and reliability of encapsulation, and having a good application prospect.

In an exemplary embodiment, a display apparatus is provided, including the display substrate of the above embodiments. The display apparatus may be any product or component with a display function, such as a mobile phone, a tablet computer, a television, a display, a notebook computer, a digital photo frame, a navigator.

According to the display substrate and the preparation method thereof and the display apparatus provided by the embodiments of the present disclosure, an encapsulation pixel definition layer including multiple protrusions and a partition structure layer including multiple columns are formed in the encapsulation region around the mounting hole, and by breaking the functional layer in the encapsulation region, the path of water and oxygen invading from the mounting hole into the display area is completely blocked, and it is ensured that the inorganic layer formed later can effectively fit the side walls of the columns and the side walls of the protrusions, thus effectively ensuring the effectiveness and reliability of encapsulation. An embodiment of the present disclosure provides a feasible, reliable and simple solution of providing a mounting hole in the effective display area, in which the mounting hole can be arranged at any position in the effective display area, so that a full screen and a borderless screen can be effectively realized, which has a good application prospect.

In the description of the embodiments of the present disclosure, an azimuth or position relationship indicated by terms "middle", "upper", "lower", "front", "rear", "vertical", "horizontal", "top", "bottom", "inner", "outer" and the like is based on the azimuth or position relationship shown in the drawings, which is only for the convenience of describing the present disclosure and simplifying the description, rather than indicating or implying that the apparatus or element referred to must have the specific orientation, or must be constructed and operated in a specific orientation, and thus cannot be interpreted as a limitation on the present disclosure.

In the description of the embodiments of the present disclosure, unless otherwise clearly specified or defined, the term "install", "connect" or "couple" should be broadly interpreted, for example, it may be a fixed connection, a detachable connection, or an integral connection; it may be a mechanical connection or an electrical connection; and it may be a direct connection, an indirect connection through an intermediary, or an internal connection between two elements. Those of ordinary skills in the art can understand the meanings of the above terms in the present disclosure according to actual situations.

Although embodiments of the present disclosure are described in the above, the above embodiments are described only for better understanding, rather than restricting the present disclosure. Any person skilled in the art can

What we claim is:

1. A display substrate, comprising a display area, a mounting hole located in the display area, and an encapsulation region located between the display area and the mounting hole, wherein:
the encapsulation region comprises an insulating layer, an encapsulation pixel definition layer arranged on the insulating layer, and a partition structure layer arranged on the encapsulation pixel definition layer, the encapsulation pixel definition layer comprises a plurality of spaced protrusions, the partition structure layer comprises a plurality of spaced columns, the columns are arranged on the protrusions, a functional layer is arranged on the plurality of spaced columns, and the functional layer is broken by the columns;
on a plane perpendicular to the base substrate, a shape of a section of the protrusion comprises a trapezoid, and a shape of a section of the column comprises an inverted trapezoid; and
on a plane perpendicular to the base substrate, a side wall of the trapezoid is an arc protruding outward, and a surface of the encapsulation pixel definition layer between adjacent trapezoids is an arc protruding toward the base substrate.

2. The display substrate according to claim 1, wherein the encapsulation region is further provided with a filling layer wrapping the partition structure layer.

3. The display substrate according to claim 1, wherein the display area comprises a driving structure layer and a display pixel definition layer defining a pixel opening area, and the display pixel definition layer in the display area and the encapsulation pixel definition layer in the encapsulation region are arranged on a same layer and made of a same material.

4. The display substrate according to claim 1, wherein in a plane perpendicular to a base substrate, in a section of the protrusion, a width of an end of the protrusion away from the base substrate is smaller than a width of an end of the protrusion close to the base substrate; and in a section of the column, a width of an end of the column away from the base substrate is larger than a width of an end of the column close to the base substrate.

5. The display substrate according to claim 4, wherein the width of the end of the column close to the base substrate is equal to the width of the end of the protrusion away from the base substrate.

6. The display substrate according to claim 2, wherein a material of the partition structure layer comprises a negative resist, and a material of the filling layer comprises an organic material.

7. The display substrate according to claim 1, wherein the functional layer comprises an organic light emitting layer and/or a cathode.

8. A display apparatus, comprising the display substrate according to claim 1.

9. A method for preparing a display substrate, the display substrate comprising a display area, a mounting hole located in the display area, and an encapsulation region located between the display area and the mounting hole, the method comprising:
forming, in the encapsulation region, an insulating layer arranged on a base substrate and an encapsulation pixel definition layer arranged on the insulating layer, the encapsulation pixel definition layer comprising a plurality of spaced protrusions;
forming a partition structure layer on the encapsulation pixel definition layer, the partition structure layer comprising a plurality of spaced columns, and the columns being arranged on the protrusions; and
forming a functional layer, the functional layer in the encapsulation region being broken by the plurality of spaced columns,
wherein on a plane perpendicular to the base substrate, a shape of a section of the protrusion comprises a trapezoid, and a shape of a section of the column comprises an inverted trapezoid, and
wherein on a plane perpendicular to the base substrate, a side wall of the trapezoid is an arc protruding outward, and a surface of the encapsulation pixel definition layer between adjacent trapezoids is an arc protruding toward the base substrate.

10. The method according to claim 9, wherein after forming the functional layer, the method further comprises: forming, in the encapsulation region, a filling layer wrapping the partition structure layer.

11. The method according to claim 9, further comprising: forming, in the display area, a driving structure layer arranged on the base substrate and a display pixel definition layer defining a pixel opening area, the display pixel definition layer in the display area and the encapsulation pixel definition layer in the encapsulation region being arranged on a same layer, made of a same material, and formed by a same process.

12. The method according to claim 9, wherein in a plane perpendicular to the base substrate, in a section of the protrusion, a width of an end of the protrusion away from the base substrate is smaller than a width of an end of the protrusion close to the base substrate; and in a section of the column, a width of an end of the column away from the base substrate is larger than a width of an end of the column close to the base substrate.

13. The method according to claim 12, wherein the width of the end of the column close to the base substrate is equal to the width of the end of the protrusion away from the base substrate.

14. The method according to claim 10, wherein a material of the partition structure layer comprises a negative resist, and a material of the filling layer comprises an organic material.

15. The method according to claim 9, wherein the functional layer comprises an organic light emitting layer and/or a cathode.

16. The display substrate according to claim 4, wherein the functional layer comprises an organic light emitting layer and/or a cathode.

* * * * *